US012368028B2

(12) United States Patent
Johanson et al.

(10) Patent No.: US 12,368,028 B2
(45) Date of Patent: Jul. 22, 2025

(54) APPARATUS FOR IMPROVED HIGH PRESSURE PLASMA PROCESSING

(71) Applicant: Applied Materials, Inc., Santa Clara, CA (US)

(72) Inventors: William R. Johanson, Gilroy, CA (US); Cory Eugene Lafollett, Santa Clara, CA (US); Kirankumar Neelasandra Savandaiah, Bangalore (IN)

(73) Assignee: APPLIED MATERIALS, INC., Santa Clara, CA (US)

( * ) Notice: Subject to any disclaimer, the term of this patent is extended or adjusted under 35 U.S.C. 154(b) by 528 days.

(21) Appl. No.: 17/737,536

(22) Filed: May 5, 2022

(65) Prior Publication Data
US 2022/0359171 A1 Nov. 10, 2022

Related U.S. Application Data

(60) Provisional application No. 63/185,754, filed on May 7, 2021.

(51) Int. Cl.
H01J 37/32 (2006.01)
C23C 14/34 (2006.01)
C23C 14/50 (2006.01)

(52) U.S. Cl.
CPC ........ H01J 37/32715 (2013.01); C23C 14/34 (2013.01); C23C 14/50 (2013.01); H01J 37/32816 (2013.01); H01J 37/32082 (2013.01); H01J 2237/2007 (2013.01); H01J 2237/20235 (2013.01); H01J 2237/332 (2013.01)

(58) Field of Classification Search
None
See application file for complete search history.

(56) References Cited

U.S. PATENT DOCUMENTS

| | | | |
|---|---|---|---|
| 6,221,221 B1* | 4/2001 | Al-Shaikh | H01J 37/32577 204/298.31 |
| 7,244,344 B2 | 7/2007 | Brown et al. | |
| 7,804,040 B2 | 9/2010 | Brown et al. | |
| 2003/0029568 A1* | 2/2003 | Brown | H01L 21/67069 156/345.52 |
| 2010/0196626 A1* | 8/2010 | Choi | C23C 16/5096 427/569 |
| 2012/0000605 A1 | 1/2012 | Kellogg et al. | |

(Continued)

FOREIGN PATENT DOCUMENTS

KR 10-2016-0112848 A 9/2016

OTHER PUBLICATIONS

PCT International Search Report and Written Opinion for PCT/US2022/027854 dated Aug. 23, 2022.

Primary Examiner — Jason Berman
(74) Attorney, Agent, or Firm — Moser Taboada

(57) ABSTRACT

Embodiments of apparatus for high pressure plasma processing are provided herein. In some embodiments, the apparatus includes an isolator plate and grounding bracket for a substrate support, such as an electrostatic chuck, in a plasma processing chamber. In some embodiments, apparatus for high pressure plasma processing includes: an electrostatic chuck; a ground return bracket spaced apart from the electrostatic chuck; and a dielectric plate disposed between the electrostatic chuck and the ground return bracket.

18 Claims, 2 Drawing Sheets

(56) References Cited

U.S. PATENT DOCUMENTS

2014/0366912 A1 12/2014 Green et al.
2019/0360100 A1 11/2019 Nguyen et al.
2020/0194276 A1 6/2020 Huang et al.

* cited by examiner

APPARATUS FOR IMPROVED HIGH PRESSURE PLASMA PROCESSING

CROSS-REFERENCE TO RELATED APPLICATIONS

This application claims benefit of U.S. provisional patent application Ser. No. 63/185,754, filed May 7, 2021, which is herein incorporated by reference in its entirety.

FIELD

Embodiments of the present disclosure generally relate to substrate processing equipment.

BACKGROUND

Plasma process chambers typically include a substrate support to support a substrate and a target disposed opposite the substrate support. The target provides a source of material for sputtering onto the substrate during processing. RF power is provided to the plasma process chamber to create a plasma in a processing volume disposed between the target and the substrate support. Some plasma processes required high pressure to enable desired film deposition properties and location on a substrate (for example, for good bottom coverage in a feature disposed on the substrate). However, the inventors have observed that arcing and plasma leakage can occur during such higher pressure plasma processes.

Accordingly, the inventors have provided improved apparatus for high pressure plasma processing.

SUMMARY

Embodiments of apparatus for high pressure plasma processing are provided herein. In some embodiments, the apparatus includes an isolator plate and grounding bracket for a substrate support, such as an electrostatic chuck, in a plasma processing chamber. In some embodiments, the plasma processing chamber can be a physical vapor deposition chamber. In some embodiments, the disclosed isolator plate and grounding bracket configuration enables up to about 6 kW of plasma power at pressures of up to about 480 mTorr, while providing a plasma using RF power in the very high frequency (VHF) band. Embodiments of the disclosed apparatus enable stable plasma formation with reduced or no arcing and/or plasma leakage as compared to conventional substrate support designs.

In some embodiments, apparatus for high pressure plasma processing includes: an electrostatic chuck; a ground return bracket spaced apart from the electrostatic chuck; and a dielectric plate disposed between the electrostatic chuck and the ground return bracket.

In some embodiments, a process chamber for high pressure plasma processing includes: a chamber body having an interior volume therein; and a substrate support disposed in the interior volume. The substrate support can include: an electrostatic chuck; a ground return bracket spaced apart from the electrostatic chuck; and a dielectric plate disposed between the electrostatic chuck and the ground return bracket. In some embodiments, the process chamber further includes a target disposed in the interior volume opposite the substrate support. In some embodiments, the process chamber further includes a VHF RF source coupled to the process chamber to provide RF power in the VHF band to the process chamber.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of scope, for the disclosure may admit to other equally effective embodiments.

Figure 1:
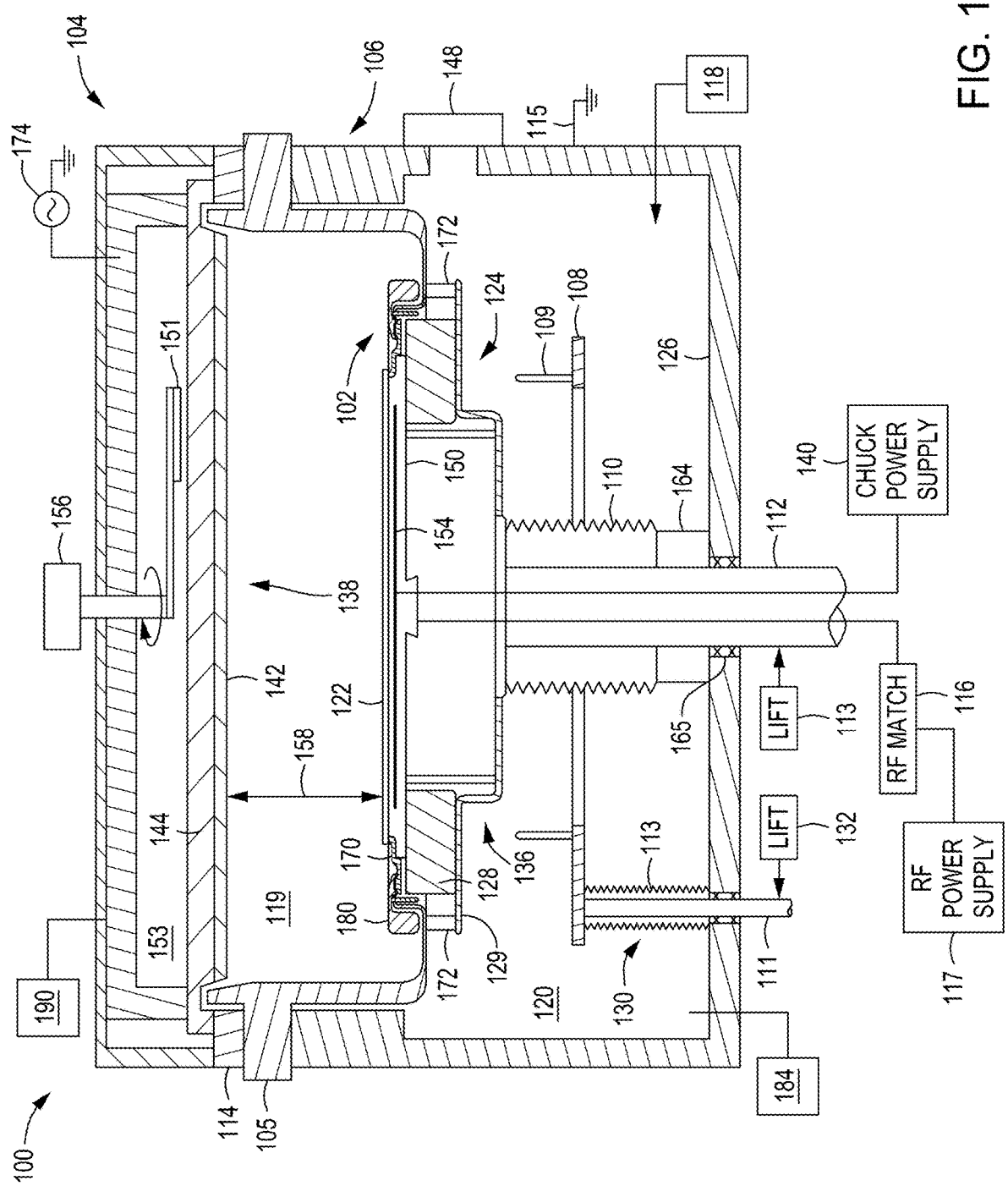
FIG. 1 depicts a schematic side view of a process chamber configured for improved high pressure plasma processing in accordance with at least some embodiments of the present disclosure.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Embodiments of apparatus for high pressure plasma processing are provided herein. In some embodiments, the apparatus includes an isolator plate and grounding bracket for a substrate support, such as an electrostatic chuck, in a plasma processing chamber. In some embodiments, the plasma processing chamber can be a physical vapor deposition chamber. In some embodiments, the disclosed isolator plate and grounding bracket configuration enables up to about 6, or up to about 9, kW of plasma power at pressures of up to about 480 mTorr, while providing a plasma using RF power in the VHF band (e.g., between about 30 to about 300 MHz, or in some embodiments, about 100-200 MHz). Embodiments of the disclosed apparatus enable stable plasma formation with reduced or no arcing and/or plasma leakage as compared to conventional substrate support designs. In embodiments, the design of the isolator plate and grounding bracket advantageously increases the capacitance between RF paths by increasing distance between the RF hot signal to the electrostatic chuck and the RF return to reduce and/or eliminate stray plasma while operating at higher chamber pressure and VHF power. One example of a suitable application for the disclosed apparatus is for tungsten deposition in a feature, which requires high pressure plasma for good bottom coverage with minimal channel overhang. The inventors have observed arcing and unstable plasma when performing such processes at required pressures with conventional RF ground return brackets.

FIG. 1 depicts a schematic side view of a process chamber 100 (e.g., a plasma processing chamber) configured for high pressure plasma processing in accordance with at least some embodiments of the present disclosure. In some embodiments, the process chamber 100 is a physical vapor deposition chamber. However, other types of processing chambers configured for different processes can also use or be modified for use with embodiments described herein.

The process chamber 100 is a vacuum chamber which is suitably adapted to maintain sub-atmospheric pressures within an interior volume 120 during substrate processing. The process chamber 100 includes a chamber body 106 covered by a lid assembly 104 which encloses a processing volume 119 located in the upper half of the interior volume 120. The chamber body 106 and lid assembly 104 may be made of metal, such as aluminum. The chamber body 106 may be grounded via a coupling to ground 115.

A substrate support 124 is disposed within the interior volume 120 to support and retain a substrate 122, such as a semiconductor wafer, for example, or other such substrate as may be electrostatically retained. The substrate support 124 may generally comprise an electrostatic chuck 150 disposed on a pedestal 136 and a hollow support shaft 112 for supporting the pedestal 136 and the electrostatic chuck 150. The electrostatic chuck 150 comprises a dielectric plate having one or more electrodes 154 disposed therein. The pedestal 136 is generally made of a metal such as stainless steel. The pedestal 136 can include a ground return bracket 129 for providing an RF return path for RF supplied to the process chamber. The ground return bracket 129 is advantageously disposed away from the back of the electrostatic chuck 150, and away from the one or more electrodes 154, which advantageously minimizes arcing. A dielectric plate 128 is disposed between the ground return bracket 129 and the electrostatic chuck 150 to prevent plasma light up in the region. The dielectric plate 128 isolates the ground return bracket 129 from the process cavity and the electrostatic chuck 150.

In some embodiments, the dielectric plate 128 can be directly coupled to or disposed against either or both of the ground return bracket 129 and the electrostatic chuck 150. The dielectric plate 128 can be a single component or can be fabricated from multiple components that provide a dielectric gap between the ground return bracket 129 and the electrostatic chuck 150 as disclosed herein. In some embodiments, the dielectric plate 128 has an outer diameter that is greater than the outer diameter of the electrostatic chuck 150.

For example, in some embodiments, the distance between the one or more electrodes 154 and the ground return bracket 129 is selected to prevent RF coupling, and will be dependent upon conditions in the chamber (e.g., RF power, chamber pressure, or the like). There will be some threshold distance where RF coupling can occur for a given chamber pressure, bias power, etc. In some embodiments, the threshold distance is on the order of a few mm. In some embodiments, the dielectric plate 128 can be an order of magnitude thicker (e.g., at least 10 mm, least 20 mm, or at least 30 mm, or in some embodiment about 30 mm) to separate the electrostatic chuck 150 from the ground return bracket 129. The greater thickness of the dielectric plate 128 (and thus, the separation between the electrostatic chuck 150 and the ground return bracket 129) advantageously facilitates enhanced arcing and/or stray plasma protection even when operating at much higher pressure/power range than typical PVD processes (e.g., at about 350 mTorr or about 480 mTorr, or more, up to 6 or up to about 9 kW RF power, and at RF frequencies between about 30 to about 300 MHz, or in some embodiments, about 100-200 MHz).

The hollow support shaft 112 provides a conduit to provide, for example, backside gases, process gases, fluids, coolants, power, or the like, to the electrostatic chuck 150. In some embodiments, the hollow support shaft 112 is coupled to a lift mechanism 113, such as an actuator or motor, which provides vertical movement of the electrostatic chuck 150 between an upper, processing position (as shown in FIG. 1) and a lower, transfer position (not shown). A bellows assembly 110 is disposed about the hollow support shaft 112 and is coupled between the electrostatic chuck 150 and a bottom surface 126 of process chamber 100 to provide a flexible seal that allows vertical motion of the electrostatic chuck 150 while preventing loss of vacuum from within the process chamber 100. The bellows assembly 110 also includes a lower bellows flange 164 in contact with an o-ring 165 or other suitable sealing element which contacts the bottom surface 126 to help prevent loss of chamber vacuum.

The hollow support shaft 112 provides a conduit for coupling a chuck power supply 140 and RF sources (e.g., RF power supply 174 and RF bias power supply 117) to the electrostatic chuck 150. In some embodiments, the RF power supply 174 and RF bias power supply 117 are coupled to the electrostatic chuck 150 via respective RF match networks (only RF match network 116 shown). In some embodiments, the substrate support 124 may alternatively include AC or DC bias power.

A substrate lift 130 can include lift pins 109 mounted on a platform 108 connected to a shaft 111 which is coupled to a second lift mechanism 132 for raising and lowering the substrate lift 130 so that the substrate 122 may be placed on or removed from the electrostatic chuck 150. The platform 108 may be in the form of a hoop lift. The electrostatic chuck 150 may include through holes to receive the lift pins 109. A bellows assembly 131 is coupled between the substrate lift 130 and bottom surface 126 to provide a flexible seal which maintains the chamber vacuum during vertical motion of the substrate lift 130.

A target 138, which acts as a cathode during processing, is disposed in the processing volume 119 opposite the substrate support 124 to at least partially define a process volume therebetween. The target 138 includes a cathode surface defined by processing volume facing surfaces of the target 138. The substrate support 124 has a support surface having a plane substantially parallel to a sputtering surface of the target 138. The target 138 is connected to one or both of a DC power source 190 and/or the RF power supply 174. The DC power source 190 can apply a bias voltage to the target 138 relative to a process shield 105 disposed in the chamber and surrounding the processing volume 119.

The target 138 generally comprises a sputtering plate 142 mounted to a backing plate 144, although a monolithic target can also be used (e.g., a sputtering plate without a backing plate). The sputtering plate 142 comprises a material to be sputtered onto the substrate 122. The backing plate 144 is made from a metal, such as, for example, stainless steel, aluminum, copper-chromium or copper-zinc. The backing plate 144 can be made from a material having a thermal conductivity that is sufficiently high to dissipate the heat generated in the target 138, which form from eddy currents that arise in the sputtering plate 142 and the backing plate 144 and also from the bombardment of energetic ions from generated plasma onto the sputtering plate 142.

In some embodiments, the process chamber 100 includes a magnetic field generator 156 to shape a magnetic field about the target 138 to improve sputtering of the target 138. The capacitively generated plasma may be enhanced by the magnetic field generator 156 in which, for example, a plurality of magnets 151 (e.g., permanent magnet or electromagnetic coils) may provide a magnetic field in the process chamber 100 that has a rotating magnetic field having a rotational axis that is perpendicular to the plane of the substrate 122. The process chamber 100 may, in addition or alternatively, comprise a magnetic field generator 156 that generates a magnetic field near the target 138 to increase an ion density in the processing volume 119 to improve the sputtering of the target material. The plurality of magnets 151 may be disposed in a cavity 153 in the lid assembly 104. A coolant such as water may be disposed in or circulated through the cavity 153 to cool the target 138.

The process chamber 100 includes a process kit 102 circumscribing various chamber components to prevent unwanted reaction between such components and ionized process material. The process kit 102 includes a process shield 105 surrounding the substrate support 124 and the target 138 to at least partially define the processing volume 119. For example, the process shield 105 may define an outer boundary of the processing volume 119. The process shield 105 includes an anode surface defined by processing volume facing surfaces of the process shield 105. In some embodiments, the process shield 105 is made of a metal such as aluminum. The process shield 105 can include an outer flange that rests on the chamber body 106 to support the process shield in place. An isolator ring 114 can be disposed atop the outer flange of the process shield 105 between the process shield 105 and the target 138 to avoid providing a ground path between the target 138 and the process shield 105.

In some embodiments, the process kit 102 includes a deposition ring 170 that rests on an outer edge of the electrostatic chuck 150. In some embodiments, the process kit 102 includes a cover ring 180 disposed on the process shield 105 to form a tortuous gas flow path therebetween. In some embodiments, in the processing position, a radially inner portion of the cover ring 180 rests on the deposition ring 170 to reduce or prevent plasma leak therebetween.

In some embodiments, a distance 158 between the target 138 and the substrate support 124 is about 60.0 mm to about 160.0 mm when the substrate support 124 is in a processing position, although other spacings can be used.

In some embodiments, a plurality of ground loops 172 are disposed between the process shield 105 and the pedestal 136. For example, the ground loops 172 can be coupled to the ground return bracket 129. The ground loops 172 may generally comprise a loop of conductive material, or alternatively, conductive straps, spring members, or the like, configured to electrically couple the process shield 105 to the pedestal 136, e.g., to the ground return bracket 129, when the substrate support 124 is in the processing position. In some embodiments, the plurality of ground loops 172 are coupled to an outer lip of the pedestal 136, such as along the outer edge of the ground return bracket 129, so that in the processing position, the ground loops 172 contact the process shield 105 to electrically couple the process shield 105 and the pedestal 136, or ground return bracket 129. In some embodiments, in the transfer position, the ground loops 172 are spaced from the process shield 105.

The process chamber 100 is coupled to and in fluid communication with a vacuum system 184 which includes a gate valve or a throttle valve (not shown) and vacuum pump (not shown) which are used to exhaust the process chamber 100. The pressure inside the process chamber 100 may be regulated by adjusting the throttle valve and/or vacuum pump. The process chamber 100 is also coupled to and in fluid communication with a process gas supply 118 which may supply one or more process gases to the process chamber 100 for processing the substrate 122 disposed therein. A slit valve 148 may be coupled to the chamber body 106 and aligned with an opening in a sidewall of the chamber body 106 to facilitate transferring the substrate 122 into and out of the chamber body 106.

In use, the DC power source 190 supplies power to the target 138 and other chamber components connected to the DC power source 190, and in combination with the RF power supply 174, energizes the sputtering gas (e.g., from the process gas supply 118) to form a plasma of the sputtering gas. The plasma formed impinges upon and bombards the sputtering surface of the target 138 to sputter material off the target 138 onto the substrate 122. In some embodiments, RF energy supplied by the RF power supply 174 may range in frequency in the VHF band (e.g., from about 30 to about 300 MHz). In some embodiments, a plurality of RF power sources may be provided (i.e., two or more) to provide RF energy in a plurality of frequencies, including those outside of the VHF band. An additional RF power source, (e.g., RF bias power supply 117) can also be used to supply a bias voltage to the substrate support 124 to attract ions form the plasma towards the substrate 122.

Figure 2:
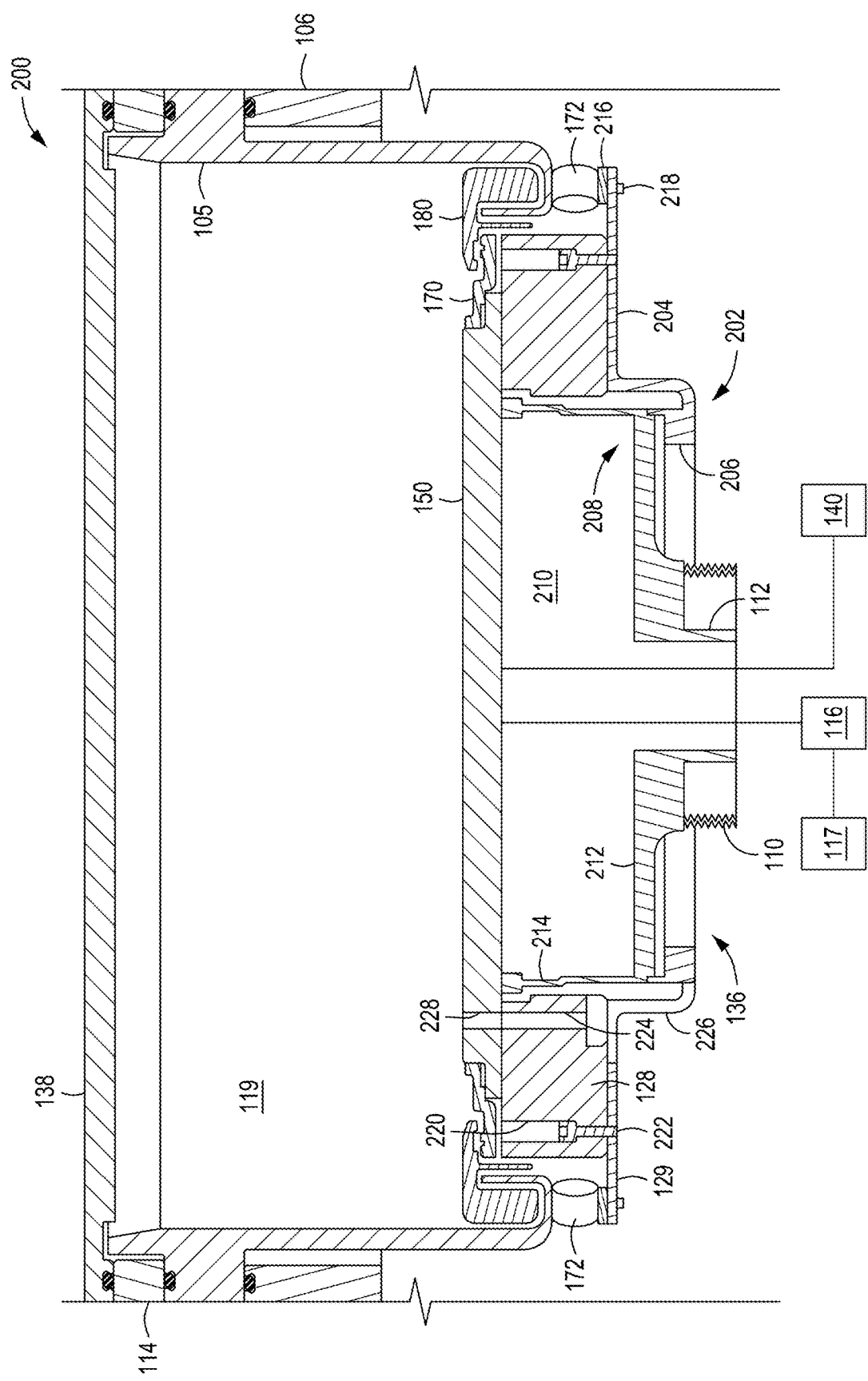
FIG. 2 depicts a schematic side view of a process chamber configured for improved high pressure plasma processing in accordance with at least some embodiments of the present disclosure.

FIG. 2 depicts a schematic side view of a process chamber 200 (e.g., a plasma processing chamber) configured for high pressure plasma processing in accordance with at least some embodiments of the present disclosure. The process chamber 200 is similar to the process chamber 100 described in FIG. 1 except as noted below.

The process chamber 200 also includes substrate support 124 disposed within the interior volume 120 to support and retain a substrate 122, such as a semiconductor wafer, for example, or other such substrate as may be electrostatically retained. The substrate support 124 can also include an electrostatic chuck 150 disposed on a pedestal 136 and a hollow support shaft 112 for supporting the pedestal 136 and the electrostatic chuck 150. The electrostatic chuck 150 comprises a dielectric plate having one or more electrodes disposed therein. The pedestal 136 can include or can be coupled to a ground return bracket 129 for providing an RF return path for RF supplied to the process chamber. The ground return bracket 129 is advantageously disposed away from the back of the electrostatic chuck 150, which advantageously minimizes arcing.

In some embodiments, the ground return bracket 129 is generally bowl-shaped, having a recessed central portion 202 and a radially extending outer flange 204. In some embodiments the radially extending outer flange is substantially planar, for example, horizontal. The recessed central portion further can include a central opening 206 through which the hollow support shaft 112 and bellows assembly 110 can extend.

A housing 208 of the pedestal 136 at least partially encloses an inner volume 210 disposed beneath the electrostatic chuck 150 for disposing or routing of other components of the substrate support 124. The housing includes a base 212 having a central opening coupled to the hollow support shaft 112 and sidewalls 214 that extend from the base 212 to the backside of the electrostatic chuck 150. The ground return bracket 129 can interface with or be coupled to the housing 208, for example, about the perimeter of the base 212. The bellows assembly 110 can be coupled to a bottom of the base 212 about the hollow support shaft 112.

The ground loops 172 may be disposed on or coupled to the ground return bracket 129, for example upon the radially extending outer flange 204. For example, the ground loops 172 can be bolted or otherwise fastened along an outer perimeter of the radially extending outer flange 204 by a plate 216 and a bolt 218. For example, in some embodiments, the dielectric plate 128 has an outer diameter that is greater than the outer diameter of the electrostatic chuck 150, the ground return bracket 129 (e.g., the radially extending outer flange 204) extends radially beyond the outer diameter of the dielectric plate 128, and the ground loops 172 are disposed on or coupled to the ground return bracket 129 (e.g., the radially extending outer flange 204) radially outward of the dielectric plate 128.

The dielectric plate 128 is disposed between the ground return bracket 129 and the electrostatic chuck 150 to prevent plasma light up in the region. The dielectric plate 128 isolates the ground return bracket 129 from the process cavity and the electrostatic chuck 150. In some embodiments, the dielectric plate 128 is annular or otherwise includes a central opening sized to fit around housing 208 of the pedestal 136, e.g., the sidewalls 214 of the housing 208. A plurality of through holes 220 can be provided through the dielectric plate, in the same direction as the central opening (e.g., vertically) to receive a fastener 222, such as a bolt, to secure the dielectric plate 128 to the ground return bracket 129 through corresponding openings in the ground return bracket 129.

Aligned openings 224, 226, 228 can be respectively formed through the dielectric plate 128, ground return bracket 129, and electrostatic chuck 150 to facilitate movement of a lift pin therethrough to raise or lower a substrate with respect to the support surface of the electrostatic chuck 150 (for example as described above).

While the foregoing is directed to embodiments of the present disclosure, other and further embodiments of the disclosure may be devised without departing from the basic scope thereof.

The invention claimed is:

1. Apparatus for high pressure plasma processing, comprising:
an electrostatic chuck;
a housing at least partially enclosing an inner volume disposed directly beneath the electrostatic chuck;
a ground return bracket spaced apart from the electrostatic chuck; and
a dielectric plate disposed between the electrostatic chuck and the ground return bracket, wherein the dielectric plate is annular or otherwise includes a central opening having the housing extending through the central opening.

2. The apparatus of claim 1, wherein the dielectric plate separates the electrostatic chuck from the ground return bracket by at least 10 mm.

3. The apparatus of claim 1, wherein the housing further comprises:
a base; and
sidewalls that extend from the base to a backside of the electrostatic chuck.

4. The apparatus of claim 3, further comprising:
a hollow support shaft, wherein the base includes a central opening coupled to the hollow support shaft such that an interior of the hollow support shaft is coupled to the inner volume.

5. The apparatus of claim 1, wherein the ground return bracket is coupled to the housing.

6. The apparatus of claim 1, wherein the ground return bracket is generally bowl-shaped, having a recessed central portion and a radially extending outer flange.

7. The apparatus of claim 6, wherein the radially extending outer flange is substantially planar and wherein the recessed central portion includes a central opening through which a hollow support shaft that supports the electrostatic chuck can extend.

8. The apparatus of claim 1, further comprising a plurality of ground loops coupled to the ground return bracket.

9. The apparatus of claim 8, wherein the dielectric plate has an outer diameter that is greater than the outer diameter of the electrostatic chuck, the ground return bracket extends radially beyond the outer diameter of the dielectric plate, and the plurality of ground loops are coupled to the ground return bracket radially outward of the dielectric plate.

10. The apparatus of claim 1, further comprising a plurality of through holes through the dielectric plate to receive a fastener to secure the dielectric plate to the ground return bracket through a plurality of corresponding openings in the ground return bracket.

11. The apparatus of claim 1, further comprising aligned openings disposed through the dielectric plate, the ground return bracket, and the electrostatic chuck to facilitate movement of a lift pin therethrough to raise or lower a substrate with respect to a support surface of the electrostatic chuck.

12. The apparatus of claim 1, wherein the housing further comprises a base having a central opening and sidewalls that extend from the base to a backside of the electrostatic chuck and further comprising:
a hollow support shaft coupled to the base about the central opening such that an interior of the hollow support shaft is coupled to the inner volume, wherein the ground return bracket is coupled to the housing and is generally bowl-shaped, having a recessed central portion and a radially extending outer flange, the recessed central portion having a central opening through which the hollow support shaft extends; and
a plurality of ground loops coupled to the radially extending outer flange of the ground return bracket.

13. Apparatus for high pressure plasma processing, comprising:
an electrostatic chuck;
a ground return bracket spaced apart from the electrostatic chuck;
a dielectric plate having a central opening disposed between the electrostatic chuck and the ground return bracket, wherein the dielectric plate separates the electrostatic chuck from the ground return bracket by at least 10 mm;
a housing at least partially enclosing an inner volume disposed directly beneath the electrostatic chuck, the housing comprising a base having a central opening and sidewalls that extend from the base to a backside of the electrostatic chuck within the central opening of the dielectric plate;
a hollow support shaft coupled to the base about the central opening such that an interior of the hollow support shaft is coupled to the inner volume, wherein the ground return bracket is coupled to the housing and is generally bowl-shaped, having a recessed central portion and a radially extending outer flange, the recessed central portion having a central opening through which the hollow support shaft extends;
aligned openings disposed through the dielectric plate, the ground return bracket, and the electrostatic chuck to facilitate movement of a lift pin therethrough to raise or lower a substrate with respect to a support surface of the electrostatic chuck; and
a plurality of ground loops coupled to the radially extending outer flange of the ground return bracket.

14. A process chamber for high pressure plasma processing, comprising:
a chamber body having an interior volume therein; and
a substrate support disposed in the interior volume, the substrate support including the apparatus for high pressure plasma processing as described in claim 1.

15. The process chamber of claim 14, further comprising:
a target disposed in the interior volume opposite the substrate support.

16. The process chamber of claim 14, further comprising:
a VHF RF source coupled to the process chamber to provide RF power in the VHF band to the process chamber.

17. The process chamber of claim 14, wherein the dielectric plate separates the electrostatic chuck from the ground return bracket by at least 10 mm.

18. The process chamber of claim 14, wherein the housing further comprises a base having a central opening and sidewalls that extend from the base to a backside of the electrostatic chuck, and wherein the substrate support further comprises:
a hollow support shaft coupled to the base about the central opening such that an interior of the hollow support shaft is coupled to the inner volume, wherein the ground return bracket is coupled to the housing and is generally bowl-shaped, having a recessed central portion and a radially extending outer flange, the recessed central portion having a central opening through which the hollow support shaft extends; and
a plurality of ground loops coupled to the radially extending outer flange of the ground return bracket.

\* \* \* \* \*